United States Patent
In et al.

(10) Patent No.: US 10,504,443 B2
(45) Date of Patent: Dec. 10, 2019

(54) DISPLAY DEVICE AND METHOD FOR OPERATING THE DISPLAY DEVICE

(71) Applicant: Samsung Display Co., Ltd., Yongin-si (KR)

(72) Inventors: Hai Jung In, Yongin-si (KR); Jin Woo Kim, Yongin-si (KR); Jin A Kang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/871,253

(22) Filed: Jan. 15, 2018

(65) Prior Publication Data

US 2018/0374424 A1    Dec. 27, 2018

(30) Foreign Application Priority Data

Jun. 21, 2017  (KR) .................. 10-2017-0078762

(51) Int. Cl.
  *G09G 3/3258* (2016.01)
  *G09G 3/3233* (2016.01)
  *H01L 51/52* (2006.01)
  *G06K 9/00* (2006.01)

(52) U.S. Cl.
  CPC ......... *G09G 3/3258* (2013.01); *G06K 9/0004* (2013.01); *G09G 3/3233* (2013.01); *H01L 51/5203* (2013.01); *G09G 2300/0819* (2013.01); *G09G 2300/0842* (2013.01); *G09G 2300/0861* (2013.01); *G09G 2300/0866* (2013.01); *G09G 2320/029* (2013.01); *G09G 2360/14* (2013.01)

(58) Field of Classification Search
  None
  See application file for complete search history.

(56) References Cited

U.S. PATENT DOCUMENTS

| | | | |
|---|---|---|---|
| 9,285,921 B2 | 3/2016 | Ahn et al. | |
| 2015/0331508 A1 | 11/2015 | Nho et al. | |
| 2015/0371074 A1* | 12/2015 | Lin | H01L 27/14679 382/124 |
| 2016/0224816 A1 | 8/2016 | Smit et al. | |
| 2017/0017824 A1* | 1/2017 | Smith | G02B 5/208 |
| 2017/0316244 A1* | 11/2017 | Yang | G06K 9/00013 |

FOREIGN PATENT DOCUMENTS

KR    10-1337042    12/2013

* cited by examiner

*Primary Examiner* — Christopher J Kohlman
(74) *Attorney, Agent, or Firm* — H.C. Park & Associates, PLC

(57) ABSTRACT

A display device includes: a display panel including display pixels; a light sensor including sensing pixels, the light sensor generating sensing data, based on incident light; an illumination sensor for generating illumination data by sensing an external illumination; and a processing unit for calculating correction data by correcting the sensing data, using the illumination data.

18 Claims, 10 Drawing Sheets

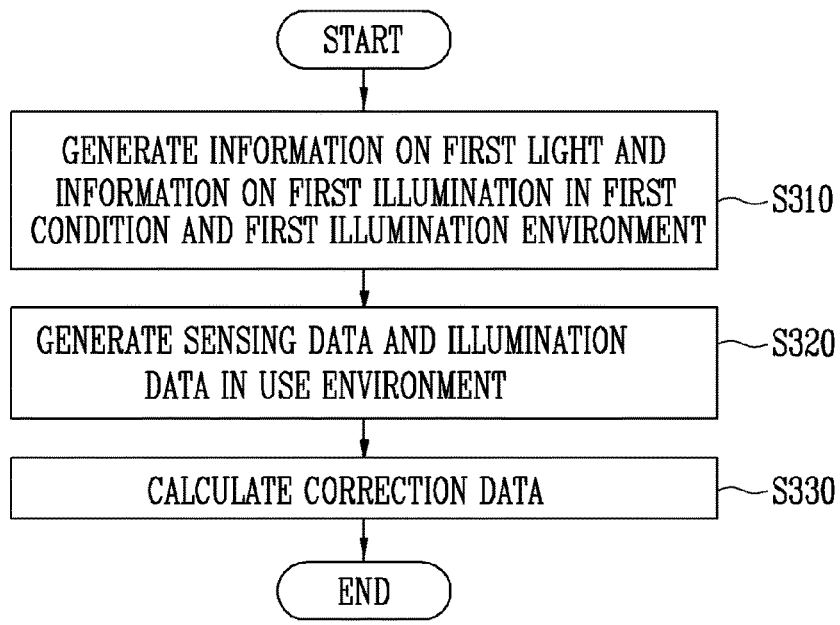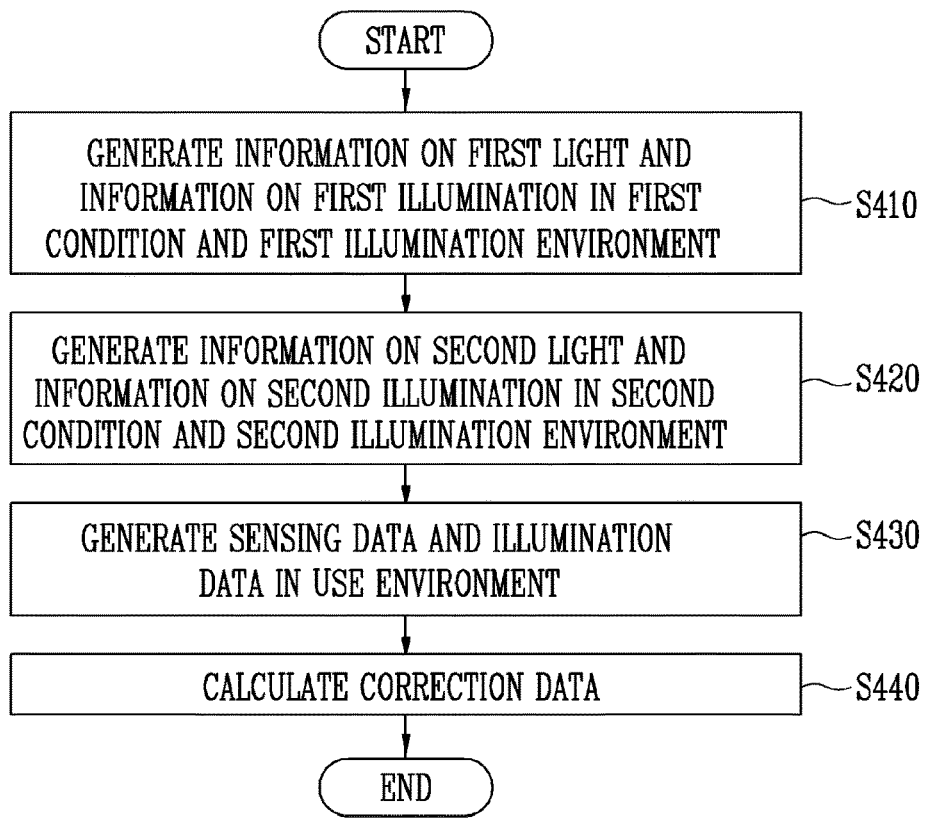

DISPLAY DEVICE AND METHOD FOR OPERATING THE DISPLAY DEVICE

CROSS-REFERENCE TO RELATED APPLICATION

This application claims priority from and the benefit of Korean Patent Application No. 10-2017-0078762, filed on Jun. 21, 2017, which is hereby incorporated by reference for all purposes as if fully set forth herein.

BACKGROUND

Field

Exemplary embodiments relate to a display device with a fingerprint sensor and a method for operating the display device.

Discussion of the Background

In general, display devices are devices that display information, and flat panel displays such as a liquid crystal display (LCD) and an organic light emitting display (OLED) are mainly used as the display devices.

Recently, a display fingerprint sensor has been developed that is capable of immediately sensing a fingerprint of a user through a display unit (i.e., an active area) that displays an image, and display devices have been developed using such a fingerprint sensor.

For example, if a display fingerprint sensor having an optical sensor technology applied thereto is used, a fingerprint of a user can be sensed using light generated by an organic light emitting diode included in a display panel. However, the amount of ambient light incident on the sensors can affect the accuracy of device.

The above information disclosed in this Background section is only for enhancement of understanding of the background of the inventive concepts, and, therefore, it may contain information that does not form the prior art that is already known in this country to a person of ordinary skill in the art.

SUMMARY

Exemplary embodiments provide display device capable of recognizing a fingerprint by using light generated by a display panel and a method for operating the display device.

Additional aspects will be set forth in the detailed description which follows, and, in part, will be apparent from the disclosure, or may be learned by practice of the inventive concepts.

According to exemplary embodiments, a display device includes: a display panel including display pixels; a light sensor including sensing pixels and configured to generate sensing data based on incident light; an illumination sensor configured to generate illumination data by sensing an external illumination; and a processing unit configured to calculate correction data by correcting the sensing data, using the illumination data.

The light sensor may be disposed to overlap with the display panel, and configured to recognize a fingerprint of a user using light generated by the display pixels.

The illumination sensor may generate the illumination data while the light sensor is operating, and the processing unit may calculate the correction data by correcting the sensing data, using the illumination data.

The light sensor may generate information on first light information in a first illumination environment and generate and second light information in a second illumination environment, the illumination sensor may generate first illumination information in the first illumination environment and generate a second illumination information in the second illumination environment, and the processing unit may calculate the correction data, based on the illumination data, the information on the first and second lights, and the information on the first and second illuminations. The second illumination environment may be an environment in which external light is lower than that of the first illumination environment.

The display device may further include a storage unit configured to store the first light information, the second light information, the first illumination information, and the second illumination information.

The external light of the first illumination environment may be 10,000 Lux or more.

The external light of the second illumination environment may be 10 Lux or less.

According to exemplary embodiments, a method for operating a display device includes: generating first light information and first illumination information in a first illumination environment; generating sensing data and illumination data in a use environment; and calculating correction data by correcting the sensing data, using the illumination data, the first light information, and the first illumination information, wherein the use environment is an environment in which a display panel on a light sensor emits light, and a finger of a user is located on the display panel and the light sensor.

The first light information, and the first illumination information may be generated in a first condition and the first illumination environment. The first condition may be an environment in which a finger or an imitation finger apparatus is located on the display panel and the light sensor.

The first light information, and the first illumination information may be generated in a second condition and the first illumination environment. The second condition may be an environment in which the display panel on the light sensor emits light, and a light absorption apparatus is located on the display panel and the light sensor.

The correction data may be calculated using the following Equation 1:

$$CD = SD - A*RD*(LI1)/(RI1). \quad \text{Equation 1}$$

Here, CD is the correction data, SD is the sensing data, A is a correction coefficient, RD is the illumination data, $LI1$ is the information on the first light, and $RI1$ is the information on the first illumination.

External light of the first illumination environment may be 10,000 Lux or more.

The first light information and the first illumination information may be stored in a storage unit.

According to exemplary embodiments, a method for operating a display device includes: generating first light information and first illumination information in a first illumination environment; generating second light information and second illumination information in a second illumination environment; generating sensing data and illumination data in a use environment; and calculating correction data by correcting the sensing data, using the illumination data, the first and second light information, and the first and second illumination information, wherein the second illumination environment is an environment in which external light is lower than that of the first illumination environment, wherein the use environment is an environment in which a display panel on a light sensor emits light, and a finger of a user is located on the display panel and the light sensor.

The first light information and the first illumination information may be generated in a first condition and the first illumination environment, and the second light information and the second illumination information may be generated in the first condition and the second illumination environment. The first condition may be an environment in which a finger or an imitation finger apparatus is located on the display panel and the light sensor.

The first light information and the first illumination information may be generated in a second condition and the first illumination environment, and the second light information and the second illumination information may be generated in the second condition and the second illumination environment. The second condition may be an environment in which the display panel on the light sensor emits light, and a light absorption apparatus is located on the display panel and the light sensor.

The correction data may be calculated using the following Equation 2:

$$CD = SD - A*RD*(LI1-LI2)/(RI1-RI). \quad \text{Equation 2}$$

Here, CD is the correction data, SD is the sensing data, A is a correction coefficient, RD is the illumination data, LI1 is the first light information, RI1 is the first illumination information, LI2 is the second light information, and RI2 is the second illumination information.

The external light of the first illumination environment may be 10,000 Lux or more.

The external light of the second illumination environment may be 10 Lux or less.

The first and second light information and the first and second illumination information may be stored in a storage unit.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

FIG. 9A is a flowchart illustrating a method for operating the display device according to still another exemplary embodiment.

FIG. 9B is a flowchart illustrating a method for operating the display device according to still another exemplary embodiment.

DETAILED DESCRIPTION OF THE ILLUSTRATED EMBODIMENTS

Figure 1:
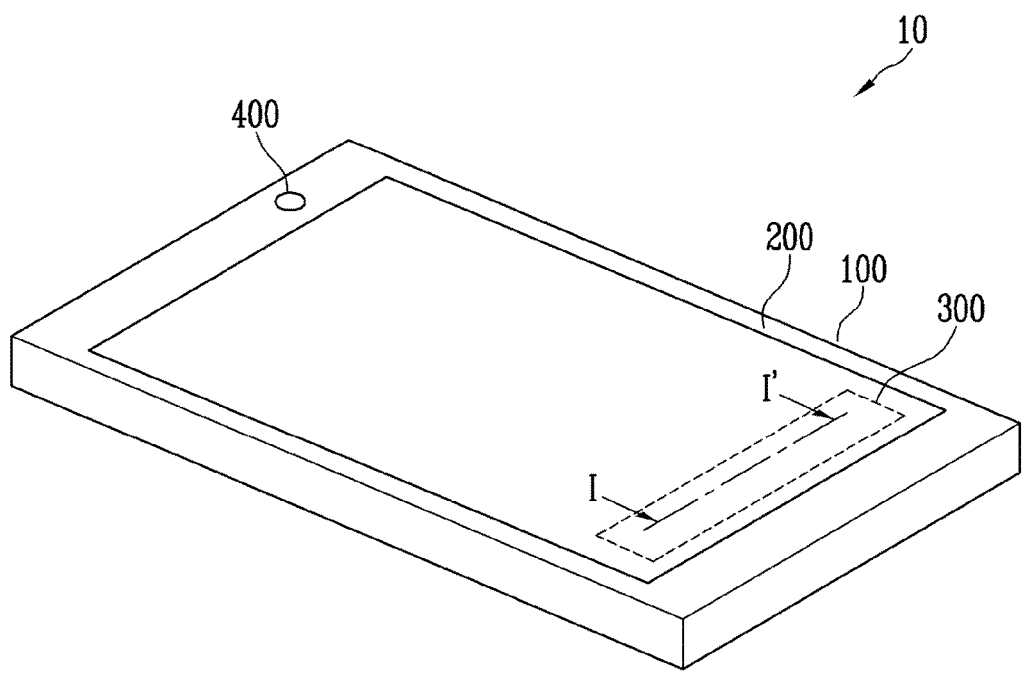
FIG. 1 is a view schematically illustrating an appearance of a display device according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. As such, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a view schematically illustrating an appearance of a display device according to an exemplary embodiment of the present disclosure.

Referring to FIG. 1, the display device 10 according to an exemplary embodiment may include a main body 100, a display panel 200, a light sensor 300, and an illumination sensor 400.

The main body 100 may mean a housing that constitutes the appearance of the display device 10, an internal circuit of the display device 10, and the like. The main body 100 may include a central processing unit (CPU), a memory, and the like.

The display panel 200 may be disposed at an outer surface of the main body 100. In FIG. 1, it is illustrated that the display panel 200 is disposed at an upper end surface of the main body 100. However, exemplary embodiments are not limited thereto, and the display panel 200 may be disposed at a side or rear surface of the main body 100.

The display panel 200 may display an image corresponding to input image data. For example, the display panel 200 may display an image corresponding to image data received through the memory or external communication.

The display panel 200 may be a liquid crystal display (LCD) panel, an organic light emitting display (OLED) panel, an electrophoretic display (EPD) panel, an electrowetting display (EWD) panel, or the like, and the kind of the display panel 200 is not limited. In the present exemplary embodiments, the OLED panel is described as an example of the display panel 200.

The display panel 200 may be flexible. Hereinafter, the term "flexible" means an ability that enables an object to be bent, i.e., a property that enables an object to be deformed without destruction.

The display panel 200 will be described in detail with reference to FIG. 2.

The light sensor 300 may be disposed in a region in which the display panel 200 is formed. For example, the light sensor 300 may be located at a lower side of the display panel 200 to overlap with the display panel 200. The relationship between the light sensor 300 and the display panel 200 will be described in detail with reference to FIG. 6.

The light sensor 300 may sense incident light. The light sensor 300 may generate sensing data, based on the sensed light. For example, the light sensor 300 may sense light reflected by a fingerprint of a user, and generate sensing data on the fingerprint of the user, based on the sensed light.

In some exemplary embodiments, the light sensor 300 may generate information on first and second lights in an arbitrarily set environment. This will be described in detail with reference to FIG. 6.

In detail, as light generated from the display panel 200 is reflected by each of ridges and valleys included in the fingerprint of the user, the light sensor 300 may sense the reflected light. Also, the light sensor 300 may generate sensing data, based on the sensed reflected light. This will be described in detail with reference to FIG. 6.

The illumination sensor 400 may be disposed on the main body 100. In FIG. 1, it is illustrated that the display device 10 includes one illumination sensor 400, but the present disclosure is not limited thereto. In some exemplary embodiments, the display device 10 may include two or more illumination sensors.

The illumination sensor 400 may sense an external illumination of the display device 10. For example, the illumination sensor 400 may sense an external illumination in real time, and generate illumination data corresponding to the sensed external illumination.

For example, the illumination sensor 400 may generate illumination data while the light sensor 300 is operating.

In some exemplary embodiments, the illumination sensor 400 may generate information on first and second illuminations in an arbitrarily set environment. This will be described in detail with reference to FIG. 6.

Although not shown in FIG. 1, the display device 10 may include a speaker for outputting an audio signal, a camera for photographing a picture, a light emitting diode (LED) for providing a flash function, a gyro sensor, an acceleration sensor, a geomagnetic sensor, an atmospheric pressure sensor, at least one control button, and the like.

According to an exemplary embodiment of the present disclosure, the display device 10 may generate correction data by correcting sensing data generated by the light sensor 300 according to an external illumination measured by the illumination sensor 400. A method for operating the display device 10 will be described in detail below.

Figure 2:
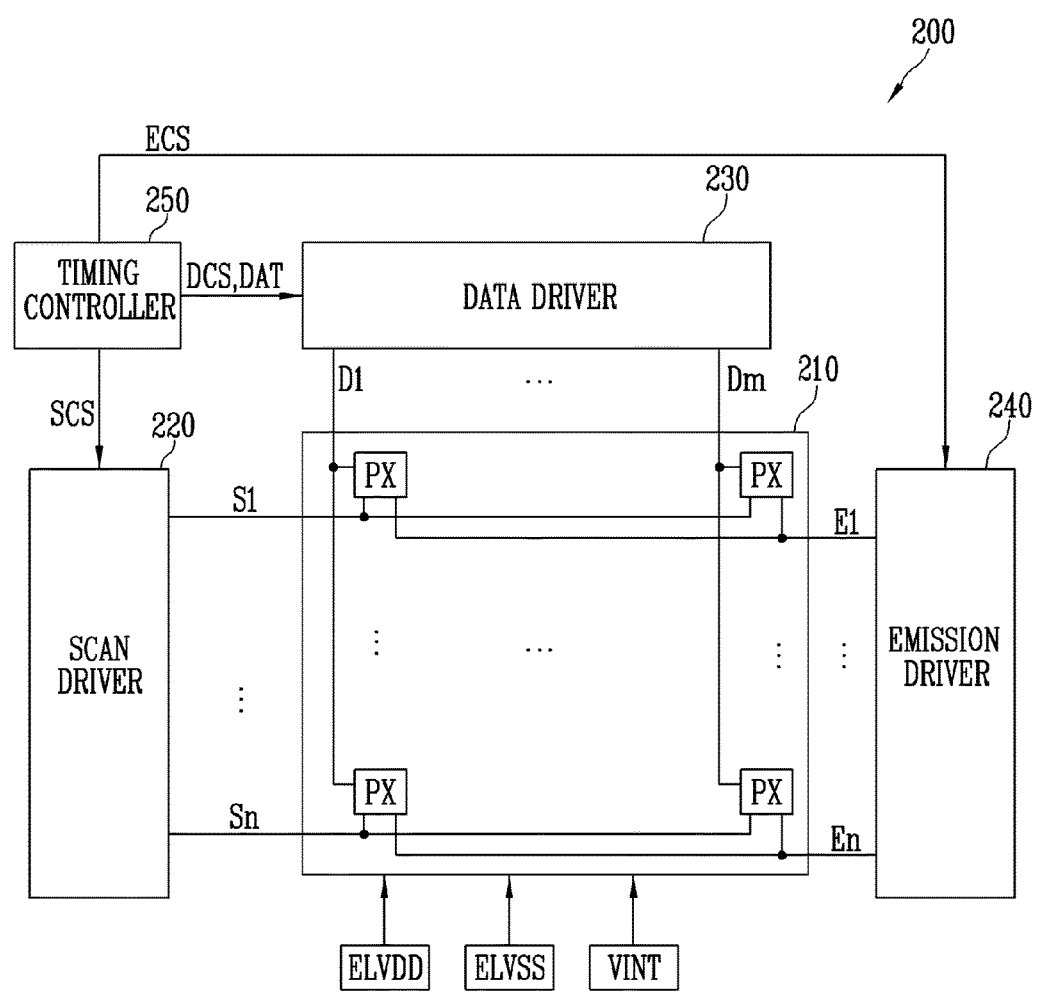
FIG. 2 is a block diagram illustrating a display panel according to an exemplary embodiment.

FIG. 2 is a block diagram illustrating a display panel according to an exemplary embodiment of the present disclosure.

Referring to FIG. 2, the display panel 200 according to an exemplary embodiment of the present disclosure may include a display unit 210.

The display unit 210 may include a plurality of pixels PX. The pixels PX may be connected to data lines D1 to Dm and scan lines S1 to Sn. For example, the pixels PX may be arranged in a matrix form at intersection portions of the data lines D1 to Dm and the scan lines S1 to Sn.

In addition, each pixels PX may be supplied with data signals and scan signals through the data lines D1 to Dm and the scan lines S1 to Sn.

The pixels PX may be supplied with scan signals from the scan lines S1 to Sn, and be supplied with data signals synchronized with the scan signals from the data lines D1 to Dm.

Each of the pixels PX may control the amount of driving current flowing from a first pixel power source ELVDD to a second pixel power source ELVSS via an organic light emitting diode (not shown). In this case, the organic light emitting diode may generate light with a luminance corresponding to the amount of the driving current.

In addition, unlike FIG. 1, each of the pixels PX may be connected to a plurality of scan lines. In some exemplary embodiments, each of the pixels PX may be connected to a current scan line, a previous scan line, and a next scan line.

For example, pixels PX located on an i-th horizontal line may be connected to an i-th scan line Si, an (i−1)th scan line Si−1, and an (i+1)th scan line Si+1.

A scan driver 220 may supply display scan signals to the scan lines S1 to Sn in response to a scan driver control signal SCS. For example, the scan driver 220 may sequentially supply the display scan signals to the scan lines S1 to Sn.

In order for the scan driver 220 to be connected to the scan lines S1 to Sn, the scan driver 220 may be directly mounted on a display substrate, or be connected to the display substrate through a separate component such as a flexible printed circuit board.

A data driver 230 may receive a data driver control signal DCS and image data DAT, input from a timing controller 250, to generate data signals.

The data driver 230 may supply the generated data signals to the data lines D1 to Dm.

In order for the data driver 230 to be connected to the data lines D1 to Dm, the data driver 230 may be directly mounted on a display substrate, or be connected to the display substrate through a separate component such as a flexible printed circuit board.

An emission driver 240 may supply a plurality of emission control signals to a plurality of emission control lines E1 to En in response to an emission driver control signal ECS supplied from the timing controller 250.

In this case, the emission control signal may have a voltage level at which a transistor supplied with the emission control signal can be turned off. That is, the emission control signal may have a gate-off voltage.

The timing controller 250 may generate the scan driver control signal SCS, the data driver control signal DCS, and the emission driver control signal ECS, corresponding to control signals supplied from the outside.

In this case, the scan driver control signal SCS may be supplied to the scan driver 220, the data driver control signal DCS may be supplied to the data driver 230, and the emission driver control signal ECS may be supplied to the emission driver 240.

In addition, the timing controller 250 may convert image data input from the outside into image data DAT suitable for specifications of the data driver 230, and supply the converted image data DAT to the data driver 230.

The scan driver control signal SCS may include a scan start signal and clock signals. The scan start signal may control supply timings of the scan signals, and the clock signals may be used to shift the scan start signal.

The emission driver control signal ECS may include an emission start signal and clock signals. The emission start signal may control a supply timing of the emission control signal, and the clock signals may be used to shift the emission start signal.

The data driver control signal DCS may include a source start signal, a source output enable signal, a source sampling clock, and the like. The source start signal may control a data sampling start time of the data driver 230. The source sampling clock may control a sampling operation of the data driver 230, based on a rising or falling edge. The source output enable signal may control an output timing of the data driver 230.

If a scan signal is supplied to a specific scan line, some pixels PX connected to the specific scan line may be supplied with a data signal supplied from the data lines D1 to Dm. In response to an emission control signal, the some pixels PX may emit light with a luminance corresponding to the supplied data signal.

The timing controller 250 may generate control signals for controlling the scan driver 220 and the data driver 230.

For example, the control signals may include the scan driver control signal SCS for controlling the scan driver 220 and the data driver control signal DCS for controlling the data driver 230.

In addition, the timing controller 250 may supply the scan driver control signal SCS to the scan driver 220, and supply the data driver control signal DCS to the data driver 230.

The timing controller 250 may convert image data DAT to be suitable for specifications of the data driver 230, and supply the converted image data DAT to the data driver 230.

In FIG. 2, it is illustrated that the scan driver 220, the data driver 230, the emission driver 240, and the timing controller 250 are individually provided. However, at least some of the components may be integrated, if necessary.

In addition, the scan driver 220, the data driver 230, the emission driver 240, and the timing controller 250 may be installed in various ways including chip on glass, chip on plastic, tape carrier package, chip on film, and the like.

Figure 3:
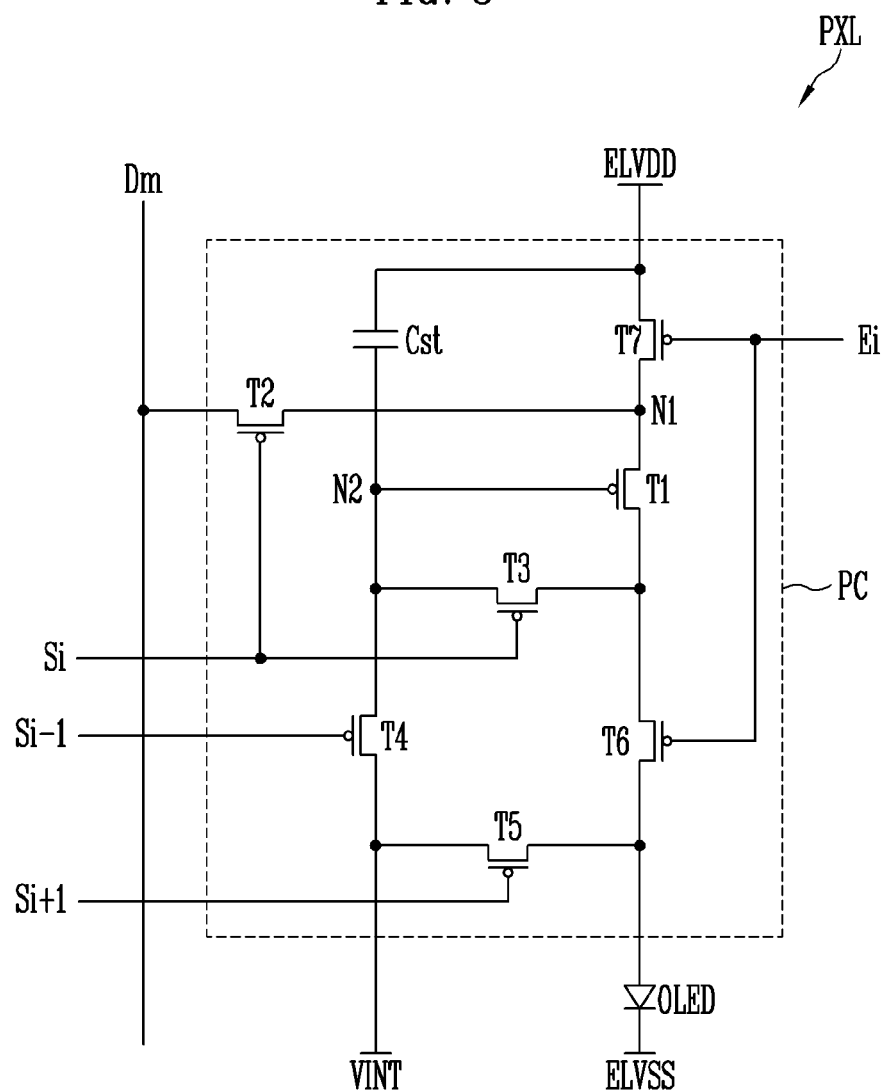
FIG. 3 is a circuit diagram illustrating a pixel according to an exemplary embodiment.

FIG. 3 is a circuit diagram illustrating a pixel according to an exemplary embodiment of the present disclosure.

For convenience of description, a display pixel PX connected to an i-th (i is a natural number) emission control line Ei and a j-th (j is a natural number) data line Dj is illustrated in FIG. 3.

Referring to FIG. 3, the display pixel PX according to an exemplary embodiment of the present disclosure may include a pixel circuit PC and an organic light emitting diode OLED.

An anode electrode of the organic light emitting diode OLED may be connected to the pixel circuit PC, and a cathode electrode of the organic light emitting diode OLED may be connected to the second pixel power source ELVSS.

The organic light emitting diode OLED may generate light with a predetermined luminance corresponding to a driving current supplied from the pixel circuit PC.

The first pixel power source ELVDD may be set to a voltage higher than that of the second pixel power source ELVSS such that a current can flow through the organic light emitting diode OLED.

The pixel circuit PC may control the amount of driving current flowing from the first pixel power source ELVDD to the second pixel power source ELVSS via the organic light emitting diode OLED, corresponding to a data signal. To this end, the pixel circuit PC may include a first transistor T1, a second transistor T2, a third transistor T3, a fourth transistor T4, a fifth transistor T5, at least one emission control transistor, and a storage capacitor Cst.

A first electrode of the first transistor (driving transistor) T1 may be connected to a first node N1, and a second electrode of the first transistor T1 may be connected to a first electrode of a sixth transistor T6. In addition, a gate electrode of the first transistor T1 may be connected to a second node N2. The first transistor T1 may control the amount of the driving current flowing from the first pixel power source ELVDD to the second pixel power source ELVSS via the organic light emitting diode OLED, corresponding to a data signal supplied to the j-th data line Dj.

The second transistor T2 may be connected between the j-th data line Dj and the first node N1. In other words, the second transistor T2 may be connected between the first electrode of the first transistor T1 and the j-th data line Dj.

In addition, a gate electrode of the second transistor T2 may be connected to an i-th scan line Si. The second transistor T2 may be turned on when a scan signal is supplied to the i-th scan line Si, to allow the j-th data line Dj and the first node N1 to be electrically connected to each other.

The third transistor T3 may be connected between the second electrode of the first transistor T1 and the second node N2. In other words, the third transistor T3 may be connected between the gate electrode of the first transistor T1 and the second electrode of the first transistor T1.

In addition, a gate electrode of the third transistor T3 may be connected to the i-th scan line Si. The third transistor T3 may be turned on when the scan signal is supplied to the i-th scan line Si, to allow the first transistor T1 to be diode-connected.

The fourth transistor T4 may be connected between the second node N2 and a third pixel power source VINT. In other words, the fourth transistor T4 may be connected between the gate electrode of the first transistor T1 and the third pixel power source VINT.

In addition, a gate electrode of the fourth transistor T4 may be connected to an (i−1)th scan line Si−1. The fourth transistor T4 may be turned on when a scan signal is supplied to the (i−1)th scan line Si−1, to supply the voltage of the third pixel power source VINT to the second node N2.

The fifth transistor T5 may be connected between the anode electrode of the organic light emitting diode OLED and the third pixel power source VINT.

In addition, a gate electrode of the fifth transistor T5 may be connected to an (i+1)th scan line Si+1. The fifth transistor T5 may be turned on when a scan signal is supplied to the (i+1)th scan line Si+1, to supply the voltage of the third pixel power source VINT to the anode electrode of the organic light emitting diode OLED.

In some exemplary embodiments, the gate electrode of the fifth transistor T5 may be connected to the (i−1)th scan line Si−1 or the i-th scan line Si.

Meanwhile, the third pixel power source VINT may be set to a voltage lower than that of the data signal.

The emission transistor may be located on the path of a driving current, and block the driving current, corresponding to an emission control signal supplied to the i-th emission control line Ei.

For example, the emission transistor may include the sixth transistor (first emission control transistor) T6 and a seventh transistor (second emission control transistor) T7.

The sixth transistor T6 may be connected between the second electrode of the first transistor T1 and the anode electrode of the organic light emitting diode OLED. In addition, a gate electrode of the sixth transistor T6 may be connected to the i-th emission control line Ei. The sixth transistor T6 may be turned off when the emission control signal is supplied to the i-th emission control line Ei, and be turned on when the emission control signal is not supplied.

The seventh transistor T7 may be connected between the first pixel power source ELVDD and the first node N1. In other words, the seventh transistor T7 may be connected between the first pixel power source ELVDD and the first electrode of the first transistor T1.

In addition, a gate electrode of the seventh transistor T7 may be connected to the i-th emission control line Ei. The seventh transistor T7 may be turned off when the emission control signal is supplied to the i-th emission control line Ei, and be turned on when the emission control signal is not supplied.

The storage capacitor Cst may be connected between the first pixel power source ELVDD and the second node N2. In other words, the storage capacitor Cst may be connected between the first pixel power source ELVDD and the gate electrode of the first transistor T1.

The storage capacitor Cst may store a voltage corresponding to the data signal and a threshold voltage of the first transistor T1.

In the present disclosure, the organic light emitting diode OLED may generate various lights including red, green, and blue, corresponding to the amount of current supplied from the driving transistor, but the present disclosure is not limited thereto. For example, the organic light emitting diode OLED may generate white light, corresponding to the amount of the current supplied from the driving transistor. In this case, a color image may be implemented using a separate color filter, etc.

Figure 4:
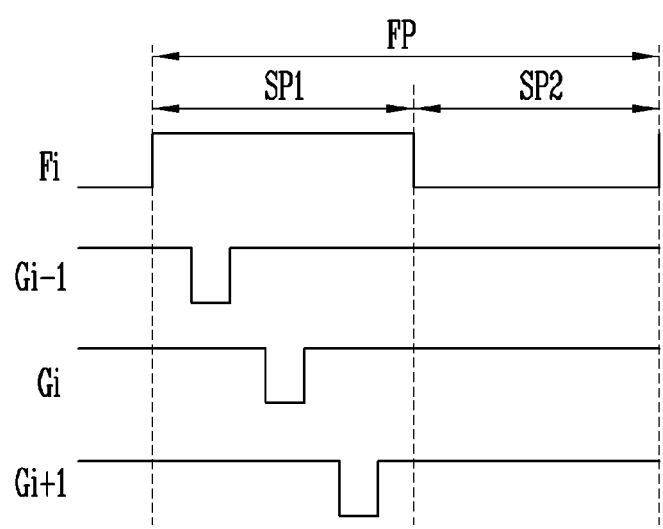
FIG. 4 is a waveform diagram illustrating an operation of the pixel according to an exemplary embodiment.

FIG. 4 is a waveform diagram illustrating an operation of the pixel according to an exemplary embodiment of the present disclosure.

In particular, during one frame period FP, a scan signal Gi−1 supplied to the (i−1)th scan line Si−1, a scan signal Gi supplied to the i-th scan line Si, a scan signal Gi+1 supplied to the (i+1)th scan line Si+1, and an emission control signal Fi supplied to the i-th emission control line are illustrated in FIG. 4.

Referring to FIG. 4, the one frame period FP may include a first sub-period SP1 and a second sub-period SP2.

In this case, an emission control signal Fi for controlling a non-emission period of the display pixel PX may be supplied in the first sub-period SP1, and the entire supply period (duty ratio) of emission control signals Fi may be controlled during the one frame period FP, so that the emission time and emission amount of the display pixel PX can be controlled.

That is, when the width W of each emission control signal Fi is decreased, the luminance of the display pixel PX may be increased. When the width W of each emission control signal Fi is increased, the luminance of the display pixel PX may be decreased.

Referring to FIGS. 3 and 4, first, the emission control signal Fi may be supplied to the i-th emission control line Ei during the first sub-period SP1. When the emission control signal Fi is supplied to the i-th emission control line Ei, the sixth transistor T6 and the seventh transistor T7 may be turned off.

If the sixth transistor T6 is turned off, the anode electrode of the organic light emitting diode OLED may be electrically blocked from the second electrode of the first transistor T1.

If the seventh transistor T7 is turned off, the first pixel power source ELVDD and the first electrode of the first transistor T1 may be electrically blocked from each other.

Therefore, the display pixel PX may be set to a non-emission state during the period in which the emission control signal Fi is supplied to the i-th emission control line Ei.

After the emission control signal Fi is supplied to the i-th emission control line Ei, the scan signal Gi−1 may be supplied to the (i−1)th scan lines Si−1. If the scan signal Gi−1 is supplied to the (i−1)th scan lines Si−1, the fourth transistor T4 may be turned on. If the fourth transistor T4 is turned on, the voltage of the third pixel power source VINT may be supplied to the second node N2.

After the scan signal Gi−1 is supplied to the (i−1)th scan lines Si−1, the scan signal Gi may be supplied to the i-th scan line Si. If the scan signal Gi is supplied to the i-th scan line Si, the second transistor T2 and the third transistor T3 may be turned on.

If the third transistor T3 is turned on, the second electrode of the first transistor T1 and the second node N2 may be electrically connected to each other. That is, if the third transistor T3 is turned on, the first transistor T1 may be diode-connected.

If the second transistor T2 is turned on, a data signal supplied from the data line Dj may be supplied to the first electrode of the first transistor T1. In this case, since the second node N2 is set to the voltage of the third pixel power source VINT, which is lower than that of the data signal, the first transistor T1 may be turned on.

If the first transistor T1 is turned on, a voltage obtained by subtracting an absolute threshold voltage of the first transistor T1 from the voltage of the data signal may be supplied to the second node N2. In this case, the storage capacitor Cst may store a voltage corresponding to the second node N2.

After the scan signal Gi is supplied to the i-th scan line Si, the scan signal Gi+1 may be supplied to the (i+1)th scan line Si+1. If the scan signal Gi+1 is supplied to the (i+1)th scan line Si+1, the fifth transistor T5 may be turned on.

If the fifth transistor T5 is turned on, the voltage of the third pixel power source VINT may be supplied to the anode electrode of the organic light emitting diode OLED. Therefore, a parasitic capacitor of the organic light emitting diode OLED may be discharged.

After that, during the second sub-period SP2, the supply of the emission control signal Fi to the i-th emission control line Ei may be stopped. If the supply of the emission control signal Fi to the i-th emission control line Ei is stopped, the sixth transistor T6 and the seventh transistor T7 may be turned on.

If the seventh transistor T7 is turned on, the first pixel power source ELVDD and the first electrode of the first transistor T1 may be electrically connected to each other. Therefore, the first transistor T1 may control the driving current flowing from the first pixel power source ELVDD to the second pixel power source ELVSS via the organic light emitting diode OLED, corresponding to the voltage of the second node N2.

Accordingly, the organic light emitting diode OLED may generate light with a predetermined luminance corresponding to the amount of current supplied from the first transistor T1.

If the sixth transistor T6 is turned on, the second electrode of the first transistor T1 and the anode electrode of the organic light emitting diode OLED may be electrically connected to each other.

Meanwhile, in FIG. 4, it is illustrated that one scan signal Gi−1 is supplied to the (i−1)th scan line Si−1 and one scan signal Gi is supplied to the i-th scan line Si, but the present disclosure is not limited thereto. In some exemplary embodiments, consecutive scan signals may be supplied to the (i−1)th scan lines Si−1, and consecutive scan signals may be supplied to the i-th scan line Si.

Figure 5:
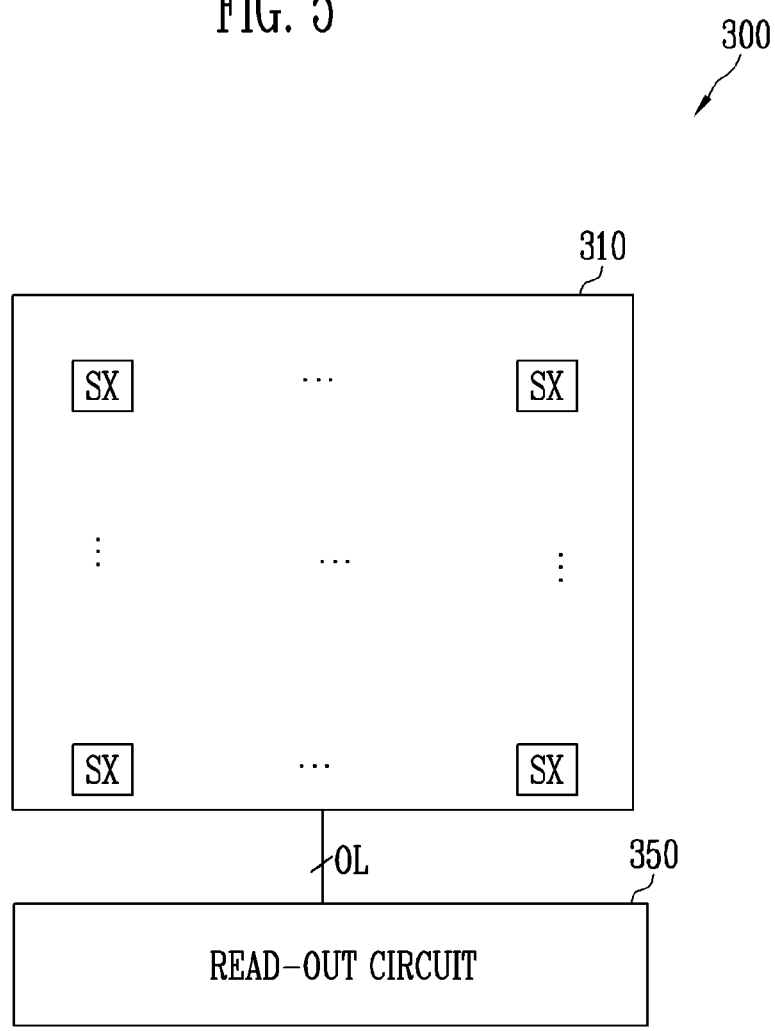
FIG. 5 is a block diagram illustrating a light sensor according to an exemplary embodiment.

FIG. 5 is a block diagram illustrating a light sensor according to an exemplary embodiment of the present disclosure.

Referring to FIG. 5, the light sensor 300 may include a sensing unit 310 and a read-out circuit 350.

The sensing unit 310 may include a plurality of sensing pixels PX. The sensing pixels SX may be connected to output lines OL.

The output lines OL may be connected to the sensing pixels SX in units of pixels.

The read-out circuit 350 may receive a signal (e.g., a current) output from the sensing pixels SX through the output lines OL.

The read-out circuit 350 may measure a variation of the signal (e.g., the current) output from the sensing pixels SX.

Figure 7:
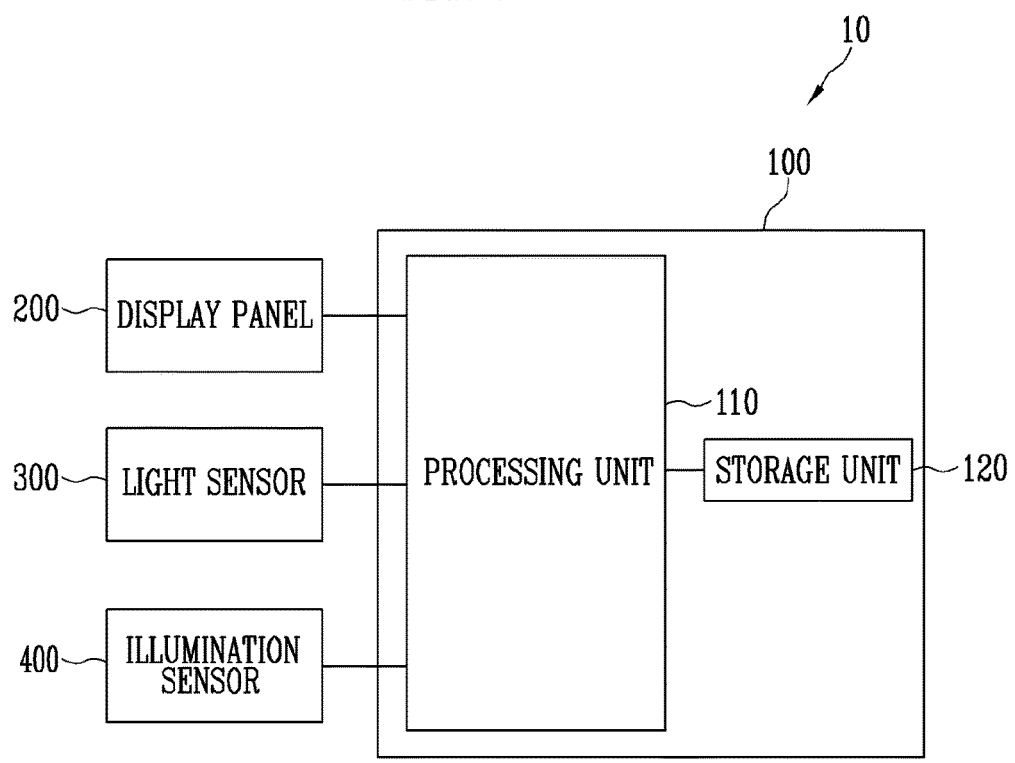
FIG. 7 is a block diagram illustrating a method for operating the display device according to an exemplary embodiment.

Although not shown in FIG. 5, the read-out circuit 350 may generate sensing data, based on the measured variation of the current and output the generated sensing data to a processing unit 110 (see FIG. 7).

In order for the read-out circuit 350 to the output lines OL, the read-out circuit 350 may be directly mounted on a substrate, or be connected to the substrate through a separate component such as a flexible printed circuit board.

Figure 6:
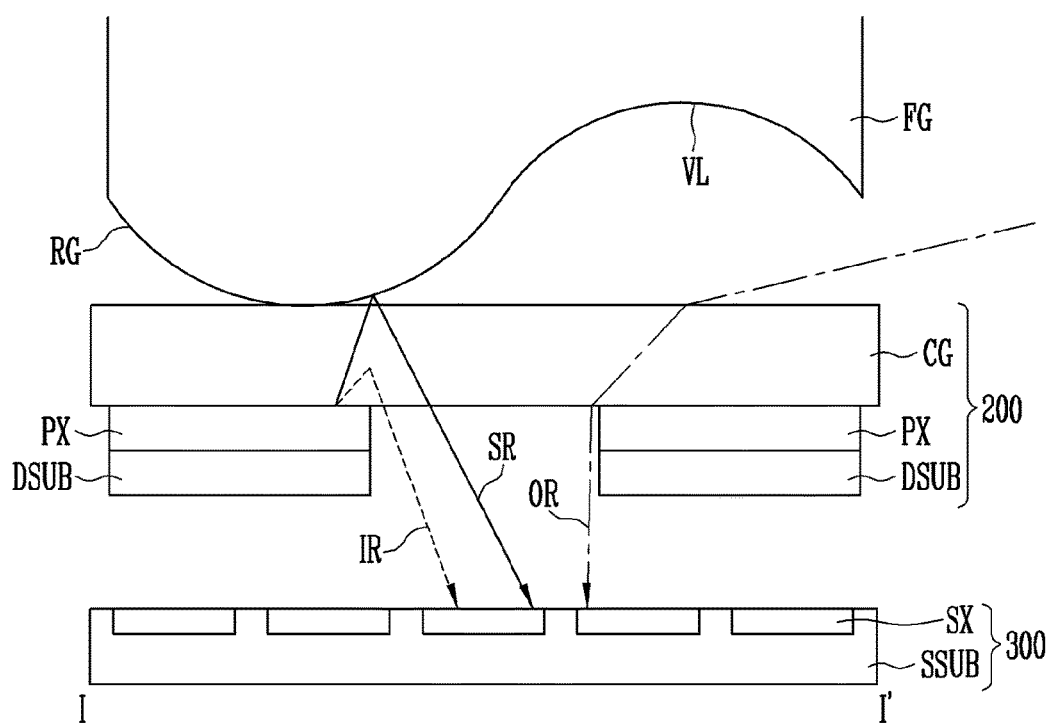
FIG. 6 is a sectional view illustrating a section of the display device taken along line I-I' shown in FIG. 1.

FIG. 6 is a sectional view illustrating a section of the display device taken along line I-I' shown in FIG. 1. For convenience of description, sections of the display panel 200 and the light sensor 300 are illustrated in FIG. 6.

Referring to FIG. 6, the display panel 200 may include a cover member CG, display pixels PX, and a display substrate SUB.

The cover member CG may include a base film and a functional layer. The functional layer may be disposed on the base film. The base film is a flexible plastic film, and may include at least one of an organic material such as polyimide (PI), polyethylene terephthalate (PET), polyethylene naphthalate (PEN), or polyethersulfone (PES) and an inorganic material such as silicon oxide, silicon nitride, silicon oxynitride, aluminum oxide, aluminum nitride, titanium oxide, or titanium nitride. The base film may be formed in a stack structure including any combination of the above-described materials.

The functional layer may include a hard coating layer, a self-healing layer, an anti-reflection layer, an anti-finger layer, and the like.

The display pixels PX may be located on the bottom end of the cover member CG.

In addition, as described in FIG. 2, each of the display pixels PX may emit light according to driving current.

The display substrate DSUB may include at least one plastic film.

For example, the display substrate DSUB may be implemented using plastic having excellent thermal resistance and durability, such as polyimide (PI), polyethylene terephthalate (PET), polycarbonate (PC), polyethylene naphthalate (PEN), polyarylate (PAR), or polyetherimide (PEI).

In addition, the display substrate DSUB may further include inorganic layers (e.g., a silicon nitride layer and/or a silicon oxide layer).

The light sensor 300 may include sensing pixels SX and a sensing substrate SSUB.

As described in FIG. 5, light may be incident onto the sensing pixels SX.

The sensing substrate SSUB may have technical characteristics similar to those of the display substrate DSUB.

Among the lights generated by the display pixels PX, sensing light SR reflected by a fingerprint of a user and internal light IR reflected or scattered by the cover member CG may be incident onto the sensing pixels SX.

In addition, external light OR introduced from an external environment of the display device 10 may be incident onto the sensing pixels SX. At this time, the internal light IR and the external light OR are lights unrelated to the fingerprint of the user, and may be regarded as noise having no effectiveness.

A finger FG may include ridges RG and valleys VL.

For example, since the lights generated by the display pixels PX are reflected from the ridges RG and the valleys VL, respectively, the sensing light SR may include information on positions of the ridges RG and the valleys VL.

Therefore, the light sensor 300 may generate sensing data by sensing the fingerprint on the basis of the incident sensing light SR.

However, when the intensity of the internal light IR or the external light OR is relatively larger than that of the sensing light, the light sensor 300 may not accurately sense the fingerprint. That is, the sensitivity of the light sensor 300 may be decreased.

FIG. 7 is a block diagram illustrating a method for operating the display device 10 according to an exemplary embodiment of the present disclosure.

Referring to FIG. 7, the main body 100 may include a processing unit 110 and a storage unit 120.

The processing unit 110 may control overall operations of the display device 10. Specifically, the processing unit 110 may control operations of the storage unit 120, the display panel 200, the light sensor 300, and the illumination sensor 400. For example, the processing unit 110 may be an application processor or CPU.

For example, the processing unit 110 may control the illumination sensor 400 to illumination data while the light sensor 300 is operating.

Also, the processing unit 110 may calculate correction data by correcting sensing data, using the illumination data.

The storage unit 120 may store data or information under control of the processing unit 110. For example, the storage unit 120 may include a memory.

Hereinafter, the method for operating the display device 10 according to the exemplary embodiment of the present disclosure will be described with reference to FIGS. 1 to 6.

The light sensor 300 may generate information on first light in a first illumination environment, and the illumination sensor 400 may generate information on a first illumination in the first illumination environment. At this time, the first illumination environment may mean an environment in which high-illumination light is irradiated. For example, the high-illumination light may mean an illumination of 10,000 Lux or more.

The processing unit 110 may store the information on the first illumination and the information on the first light in the storage unit 120.

The light sensor 300 may generate sensing data in a use environment, and the illumination sensor 400 may generate illumination data in the use environment. At this time, the use environment may mean an environment in which the display panel 200 on the light sensor 300 emits light, and a finger of a user is located on the display panel 200 and the light sensor 300.

A noise component may be included in the sensing data as described above.

The processing unit 110 may calculate correction data by correcting the sensing data, using the illumination data, the information on the first light, and the information on the first illumination.

At this time, Equation 1 used by the processing unit 110 is as follows.

$$CD=SD-A*RD*(LI1)/(RI1) \qquad \text{Equation 1}$$

CD denotes the correction data, SD denotes the sensing data, A denotes a correction coefficient, RD denotes the illumination data, LI1 denotes the information on the first light, and RI1 denotes the information on the first illumination.

In some exemplary embodiments, the correction coefficient may have a value of 0 to 1.

The processing unit 110 may calculate correction data from which the noise component is removed by using Equation 1.

In another exemplary embodiment of the present disclosure, the light sensor 300 may further generate information on second light in a second illumination environment, and the illumination sensor 400 may further generate information on a second illumination in the second illumination environment. At this time, the second illumination environment may mean an environment in which low-illumination external light is irradiated, and the second illumination may be smaller than the first illumination. For example, the low-illumination external light may mean an illumination of 10 Lux or less.

The processing unit 110 may store the information on the second illumination and the information on the second light in the storage unit 120.

The processing unit 110 may calculate correction data by correcting the sensing data, using the illumination data, the information on the first and second illuminations, and the information on the first and second lights.

At this time, Equation 2 used by the processing unit 110 is as follows.

$$CD=SD-A*RD*(LI1-LI2)/(RI1-RI) \qquad \text{Equation 2}$$

CD denotes the correction data, SD denotes the sensing data, A denotes the correction coefficient, RD denotes the illumination data, LI1 denotes the information on the first light, RI1 denotes the information on the first illumination, LI2 denotes the information on the second light, and RI2 denotes the information on the second illumination.

In this case, the processing unit 110 may calculate correction data from which the noise component is removed by using Equation 2.

Figure 8A:
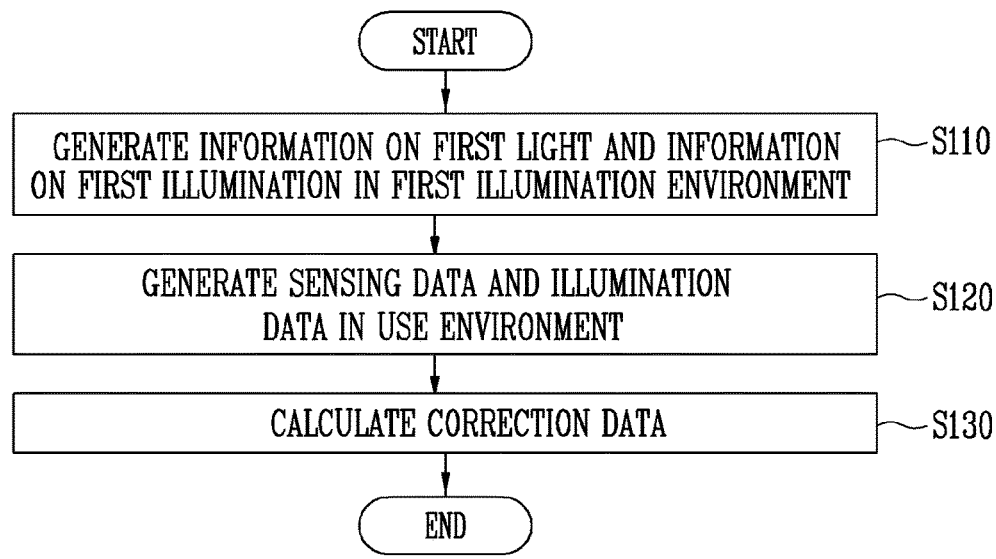
FIG. 8A is a flowchart illustrating a method for operating the display device according to an exemplary embodiment.

FIG. 8A is a flowchart illustrating a method for operating the display device according to an exemplary embodiment of the present disclosure. Referring to FIGS. 7, 8A, and Equation 1, the display device 10 may operate as follows.

The display device 10 may generate information LI1 on first light and information RI1 on a first illumination in a first illumination environment (step S110). For example, the light sensor 300 and the illumination sensor 400 of the display device 10 may generate the information LI1 on the first light and the information RI1 on the first illumination in the first illumination environment, respectively. At this time, the first illumination environment may mean an environment in which high-illumination external light is irradiated.

Referring to FIG. 6, nothing exists on the light sensor 300, and the display panel 200 does not emit light. Therefore, the light sensor 300 may generate the information LI1 on the first light, based on only the external light OR.

The display device 10 may generate sensing data SD and illumination data RD in a use environment (step S120). For example, the light sensor 300 and the illumination sensor 400 of the display device 10 may generate the sensing data SD and the illumination data RD in the use environment, respectively. At this time, the use environment may mean an environment in which the display panel 200 on the light sensor 300 emits light, and a finger of a user is located on the display panel 200 and the light sensor 300.

The display device 10 may calculate correction data CD (step S130). For example, the processing unit 110 of the display device 10 may calculate the correction data CD by correcting the sensing data SD, using the illumination data RD, the information LI1 on the first light, and the information RI1 on the first illumination.

In some exemplary embodiments, the display device 10 may calculate the correction data CD by using Equation 1.

The processing unit 110 of the display device 10 may calculate the correction data CD from which a noise component is removed. Thus, the sensitivity of the display device 10 may be improved.

Figure 8B:
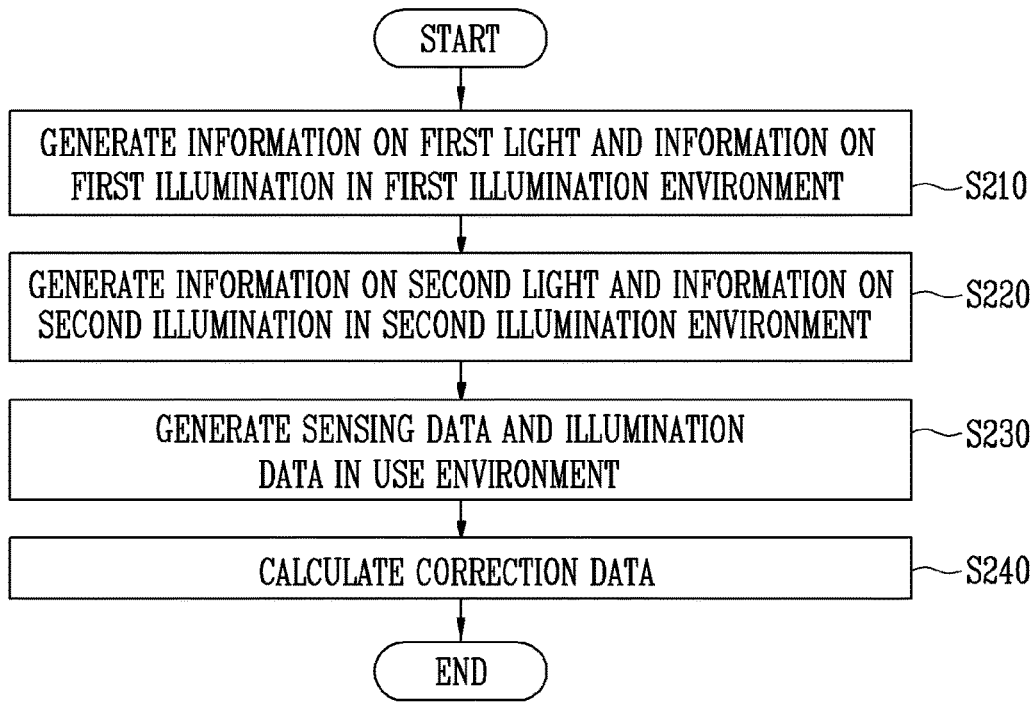
FIG. 8B is a flowchart illustrating a method for operating the display device according to another exemplary embodiment.

FIG. 8B is a flowchart illustrating a method for operating the display device according to another exemplary embodiment of the present disclosure. Referring to FIGS. 7, 8B, and Equation 2, the display device 10 may operate as follows.

The display device 10 may generate information LI1 on first light and information RI1 on a first illumination in a first illumination environment (step S210). For example, the light sensor 300 and the illumination sensor 400 of the display device 10 may generate the information LI1 on the first light and the information RI1 on the first illumination in the first illumination environment, respectively. At this time, the first illumination environment may mean an environment in which high-illumination external light is irradiated.

The display device 10 may generate information LI2 on second light and information RI2 on a second illumination in a second illumination environment (step S220). For example, the light sensor 300 and the illumination sensor 400 of the display device 10 may generate the information LI2 on the second light and the information RI2 on the second illumination in the second illumination environment, respectively. At this time, the second illumination environment may mean an environment in which low-illumination external light is irradiated.

Referring to FIG. 6, nothing exists on the light sensor 300, and the display panel 200 does not emit light. Therefore, the light sensor 300 may generate the information LI1 on the first light and the information LI2 on the second light, based on only the external light OR.

The display device 10 may generate sensing data SD and illumination data RD in a use environment (step S230). For example, the light sensor 300 and the illumination sensor 400 of the display device 10 may generate the sensing data SD and the illumination data RD in the use environment, respectively. At this time, the use environment may mean an environment in which the display panel 200 on the light sensor 300 emits light, and a finger of a user is located on the display panel 200 and the light sensor 300.

The display device 10 may calculate correction data CD (step S240). For example, the processing unit 110 of the display device 10 may calculate the correction data CD by correcting the sensing data SD, using the illumination data RD, the information LI1 and LI2 on the first and second lights, and the information RI1 and RI2 on the first and second illuminations.

In some exemplary embodiments, the display device 10 may calculate the correction data CD by using Equation 2.

The processing unit 110 of the display device 10 may calculate the correction data CD from which a noise component is removed. Thus, the sensitivity of the display device 10 may be improved.

FIG. 9A is a flowchart illustrating a method for operating the display device according to still another exemplary embodiment of the present disclosure. Contents overlapping with those of FIG. 8A will be omitted to avoid redundancy.

Referring to FIGS. 7, 8A, 9A, and Equation 1, the display device 10 may operate as follows.

The display device 10 may generate information LI1 on first light and information RI1 on a first illumination in a first condition and a first illumination environment (step S310). At this time, the first condition may mean an environment in which a finger or an imitation finger apparatus is located on the display panel 200 and the light sensor 300. In this case, the first condition may be set such that the light sensor 300 generates the information LI1 on the first light in a situation similar to an actual use environment.

The display device 10 may generate sensing data SD and illumination data RD in a use environment (step S320).

The display device 10 may calculate correction data CD (step S330).

In some exemplary embodiments, the display device 10 may calculate the correction data CD by using Equation 1.

The processing unit 110 of the display device 10 may calculate the correction data CD from which a noise component is removed. Thus, the sensitivity of the display device 10 may be improved.

FIG. 9B is a flowchart illustrating a method for operating the display device according to still another exemplary embodiment of the present disclosure. Contents overlapping with those of FIG. 9A will be omitted to avoid redundancy.

Referring to FIGS. 7, 9A, 9B, and Equation 2, the display device 10 may operate as follows.

The display device 10 may generate information LI1 on first light and information RI1 on a first illumination in a first condition and a first illumination environment (step S410).

The display device 10 may generate information LI2 on second light and information RI2 on a second illumination in the first condition and a second illumination environment (step S420).

In this case, the first condition may be set such that the light sensor 300 generates the information LI1 on the first light in a situation similar to an actual use environment.

The display device 10 may generate sensing data SD and illumination data RD in a use environment (step S430).

The display device 10 may calculate correction data CD (step S440).

In some exemplary embodiments, the display device 10 may calculate the correction data CD by using Equation 2.

The processing unit 110 of the display device 10 may calculate the correction data CD from which a noise component is removed. Thus, the sensitivity of the display device 10 may be improved.

Figure 10A:
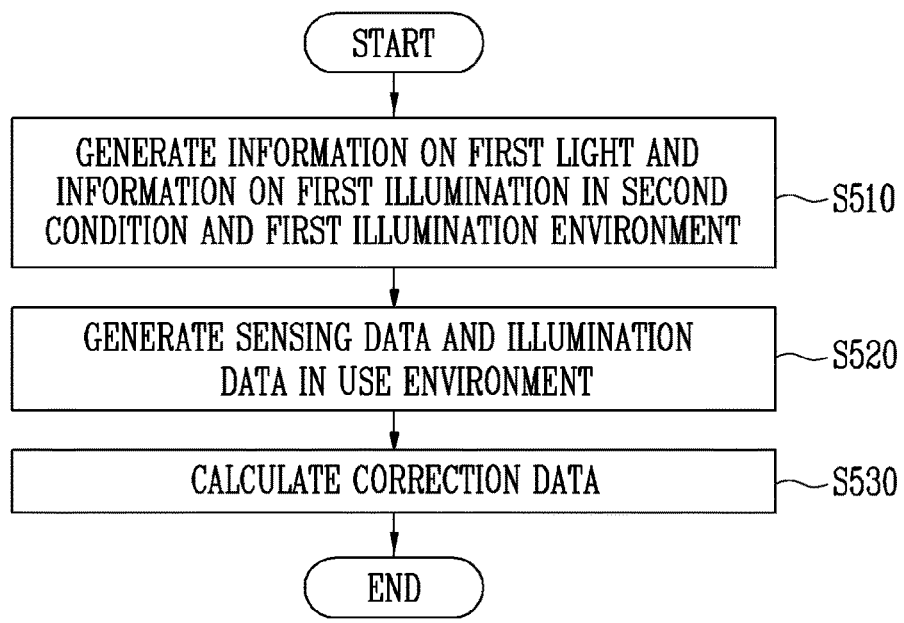
FIG. 10A is a flowchart illustrating a method for operating the display device according to still another exemplary embodiment.

FIG. 10A is a flowchart illustrating a method for operating the display device according to still another exemplary embodiment of the present disclosure. Contents overlapping with those of FIG. 8A will be omitted to avoid redundancy.

Referring to FIGS. 7, 8A, 10A, and Equation 1, the display device 10 may operate as follows.

The display device 10 may generate information LI1 on first light and information RI1 on a first illumination in a second condition and a first illumination environment (step S510). At this time, the second condition may mean an environment in which the display panel 200 on the light sensor 300 emits light, and a light absorption apparatus is located on the display panel 200 and the light sensor 300.

Referring to FIG. 6, the light absorption apparatus may suppress the generation of the sensing light SR. Therefore, the light sensor 300 may generate the information LI1 on the first light, based on only the internal light IR and the external light OR.

The display device 10 may generate sensing data SD and illumination data RD in a use environment (step S520).

The display device 10 may calculate correction data CD (step S530).

In some exemplary embodiments, the display device 10 may calculate the correction data CD by using Equation 1.

The processing unit 110 of the display device 10 may calculate the correction data CD from which a noise component is removed. Thus, the sensitivity of the display device 10 may be improved.

Figure 10B:
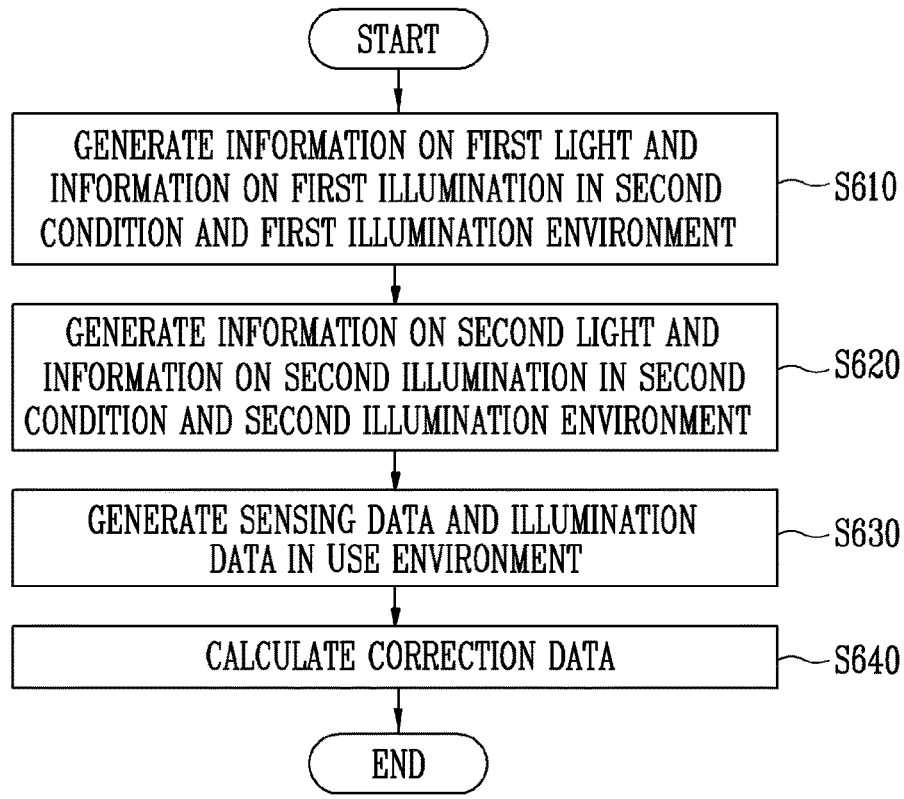
FIG. 10B is a flowchart illustrating a method for operating the display device according to still another exemplary embodiment.

FIG. 10B is a flowchart illustrating a method for operating the display device according to still another exemplary embodiment of the present disclosure. Contents overlapping with those of FIG. 10A will be omitted to avoid redundancy.

Referring to FIGS. 7, 10A, 10B, and Equation 2, the display device 10 may operate as follows.

The display device 10 may generate information LI1 on first light and information RI1 on a first illumination in a second condition and a first illumination environment (step S610).

The display device 10 may generate information LI2 on second light and information RI2 on a second illumination in the second condition and a second illumination environment (step S620).

Referring to FIG. 6, the light absorption apparatus may suppress the generation of the sensing light SR. Therefore, the light sensor 300 may generate the information LI1 on the first light and the information LI2 on the second light, based on only the internal light IR and the external light OR.

The display device 10 may generate sensing data SD and illumination data RD in a use environment (step S630).

The display device 10 may calculate correction data CD (step S640).

In some exemplary embodiments, the display device 10 may calculate the correction data CD by using Equation 2.

The processing unit 110 of the display device 10 may calculate the correction data CD from which a noise component is removed. Thus, the sensitivity of the display device 10 may be improved.

In the display device and the method for operating the display device according to the present disclosure, a fingerprint can be recognized using light generated by the display panel, and the sensitivity of the display device may be improved.

The processing unit 110 and the storage unit 120 and/or one or more components thereof, may be implemented via one or more general purpose and/or special purpose components, such as one or more discrete circuits, digital signal processing chips, integrated circuits, application specific integrated circuits, microprocessors, processors, programmable arrays, field programmable arrays, instruction set processors, and/or the like. In this manner, the features, functions, processes, etc., described herein may be implemented via software, hardware (e.g., general processor, digital signal processing (DSP) chip, an application specific integrated circuit (ASIC), field programmable gate arrays (FPGAs), etc.), firmware, or a combination thereof. As such, driving circuits of display panel 200 and/or one or more components thereof may include or otherwise be associated with one or more memories (not shown) including code (e.g., instructions) configured to cause the processing unit 110 and the storage unit 120 and/or one or more components thereof to perform one or more of the features, functions, processes, etc., described herein.

The memories may be any medium that participates in providing code to the one or more software, hardware, and/or firmware components for execution. Such memories may be implemented in any suitable form, including, but not limited to, non-volatile media, volatile media, and transmission media. Non-volatile media include, for example, optical or magnetic disks. Volatile media include dynamic memory. Transmission media include coaxial cables, copper wire, and fiber optics. Transmission media can also take the form of acoustic, optical, or electromagnetic waves. Common forms of computer-readable media include, for example, a floppy disk, a flexible disk, hard disk, magnetic tape, any other magnetic medium, a compact disk-read only memory (CD-ROM), a rewriteable compact disk (CDRW), a digital video disk (DVD), a rewriteable DVD (DVD-RW), any other optical medium, punch cards, paper tape, optical mark sheets, any other physical medium with patterns of holes or other optically recognizable indicia, a random-access memory (RAM), a programmable read only memory (PROM), and erasable programmable read only memory (EPROM), a FLASH-EPROM, any other memory chip or cartridge, a carrier wave, or any other medium from which information may be read by, for example, a controller/processor.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A display device comprising:
a display panel comprising display pixels;
a light sensor comprising sensing pixels and configured to generate sensing data based on incident light;
an illumination sensor configured to generate illumination data by sensing an external illumination;
a processing unit configured to calculate correction data by correcting the sensing data, using the illumination data; and
a storage unit configured to store a first light information, a second light information, a first illumination information, and a second illumination information,
wherein the light sensor is configured to generate the first light information in a first illumination environment and generate the second light information in a second illumination environment,
wherein the illumination sensor is configured to generate a first illumination information in the first illumination environment and generate a second illumination information in the second illumination environment,
wherein the processing unit is configured to calculate the correction data based on the illumination data, a difference between the first light information and the second light information, and a difference between the first illumination information and the second illumination information, and
wherein the second illumination environment is an environment in which external light is lower than that of the first illumination environment.

2. The display device of claim 1, wherein the light sensor is disposed to overlap with the display panel, and is configured to recognize a fingerprint of a user using light generated by the display pixels.

3. The display device of claim 1, wherein the illumination sensor is configured to generate the illumination data while the light sensor is operating, and
   the processing unit is configured to calculate the correction data by correcting the sensing data, using the illumination data.

4. The display device of claim 1, wherein the external light of the first illumination environment is 10,000 Lux or more.

5. The display device of claim 1, wherein the external light of the second illumination environment is 10 Lux or less.

6. A method for operating a display device, the method comprising:
   generating a first light information and a first illumination information in a first illumination environment;
   generating sensing data and illumination data in a use environment; and
   calculating correction data by correcting the sensing data, using the illumination data, the first light information, and the first illumination information,
   wherein the use environment is an environment in which a display panel on a light sensor emits light, and a finger of a user is located on the display panel and the light sensor, and
   wherein the correction data is calculated based on the illumination data and a ratio of the first light information and the first illumination information.

7. The method of claim 6, wherein the first light information, and the first illumination information are generated in a first condition and the first illumination environment,
   wherein the first condition is an environment in which a finger or an imitation finger apparatus is located on the display panel and the light sensor.

8. The method of claim 6, wherein the first light information, and the first illumination information are generated in a second condition and the first illumination environment,
   wherein the second condition is an environment in which the display panel on the light sensor emits light, and a light absorption apparatus is located on the display panel and the light sensor.

9. The method of claim 6, wherein the correction data is calculated using the following Equation 1:

$$CD=SD-A*RD*(LI1)/(RI1),\qquad \text{Equation 1}$$

wherein CD is the correction data, SD is the sensing data, A is a correction coefficient, RD is the illumination data, LI1 is the first light information, and RI1 is the first illumination information.

10. The method of claim 6, wherein external light of the first illumination environment is 10,000 Lux or more.

11. The method of claim 6, wherein the first light information and the first illumination information are stored in a storage unit.

12. A method for operating a display device, the method comprising:
   generating a first light information and a first illumination information in a first illumination environment;
   generating a second light information and a second illumination information in a second illumination environment;
   generating sensing data and illumination data in a use environment; and
   calculating correction data by correcting the sensing data, using the illumination data, the first light information, the second light information, the first illumination information, and the second illumination information,
   wherein the second illumination environment is an environment in which external light is lower than that of the first illumination environment, and
   wherein the use environment is an environment in which a display panel on a light sensor emits light, and a finger of a user is located on the display panel and the light sensor, and
   wherein the correction data is calculated based on the illumination data, a difference between the first light information and the second light information, and a difference between the first illumination information and the second illumination information.

13. The method of claim 12, wherein the first light information and the first illumination information are generated in a first condition and the first illumination environment, respectively,
   the second light information and the second illumination information are generated in the first condition and the second illumination environment, respectively, and
   the first condition is an environment in which a finger or an imitation finger apparatus is located on the display panel and the light sensor.

14. The method of claim 12, wherein the first light information and the first illumination information are generated in a second condition and the first illumination environment, respectively,
   the second light information and the second illumination information are generated in the second condition and the second illumination environment, respectively, and
   the second condition is an environment in which the display panel on the light sensor emits light, and a light absorption apparatus is located on the display panel and the light sensor.

15. The method of claim 12, wherein the correction data is calculated using the following Equation 2:

$$CD=SD-A*RD*(LI1-LI2)/(RI1-RI2),\qquad \text{Equation 2}$$

wherein CD is the correction data, SD is the sensing data, A is a correction coefficient, RD is the illumination data, LI1 is the first light information, RI1 is the first illumination information, LI2 is the second light information, and RI2 is the second illumination information.

16. The method of claim 12, wherein the external light of the first illumination environment is 10,000 Lux or more.

17. The method of claim 12, wherein the external light of the second illumination environment is 10 Lux or less.

18. The method of claim 12, wherein the first light information, the second light information, the first illumination information, and the second illumination information are stored in a storage unit.

* * * * *